United States Patent
Ha

(10) Patent No.: US 7,759,981 B2
(45) Date of Patent: Jul. 20, 2010

(54) AMPLIFYING CIRCUIT OF SEMICONDUCTOR INTEGRATED CIRCUIT

(75) Inventor: Sung-Joo Ha, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 77 days.

(21) Appl. No.: 11/819,610

(22) Filed: Jun. 28, 2007

(65) Prior Publication Data

US 2008/0036535 A1 Feb. 14, 2008

(30) Foreign Application Priority Data

Aug. 14, 2006 (KR) .................. 10-2006-0076802

(51) Int. Cl.
- G01R 19/00 (2006.01)
- G11C 7/00 (2006.01)
- H03F 3/45 (2006.01)

(52) U.S. Cl. .............. 327/53; 327/54; 327/66; 327/67

(58) Field of Classification Search ............ 327/50, 327/51, 52, 54, 56, 58–60, 62–69, 71, 72, 327/74, 77–81, 88, 89, 96, 127, 246, 266, 327/274, 280, 287, 359, 560–563; 365/203, 365/207; 330/253

See application file for complete search history.

(56) References Cited

U.S. PATENT DOCUMENTS

| 6,359,510 B1 * | 3/2002 | Ishii et al. .................. 330/253 |
| 6,567,327 B2 * | 5/2003 | Tsuchi ....................... 365/203 |
| 6,583,667 B1 * | 6/2003 | Dasgupta et al. ............ 330/254 |
| 6,717,468 B1 * | 4/2004 | Jeong et al. ................. 330/253 |
| 6,816,425 B2 | 11/2004 | Graham et al. |
| 7,358,810 B2 * | 4/2008 | Kwon et al. ................ 330/253 |
| 2006/0290427 A1 * | 12/2006 | Oh ............................. 330/255 |
| 2007/0146034 A1 * | 6/2007 | Acharya ..................... 327/218 |

FOREIGN PATENT DOCUMENTS

| JP | 2002197870 | 7/2002 |
| KR | 10-1997-0003224 | 1/1997 |
| KR | 1020010048997 | 6/2001 |
| KR | 1020030002504 | 1/2003 |

* cited by examiner

*Primary Examiner*—Lincoln Donovan
*Assistant Examiner*—Brandon S Cole
(74) *Attorney, Agent, or Firm*—Venable LLP; Jeffri A. Kaminski

(57) ABSTRACT

An amplifying circuit of a semiconductor integrated circuit includes a data amplifier that outputs an up-signal and a down-signal amplified according to a comparison result between an up-data signal and a down-data signal in response to a control signal. The data amplifier repeats an operation of amplifying the up-signal and the down-signal according to the comparison result between the up-signal and the down-signal to be fed back to the data amplifier.

15 Claims, 5 Drawing Sheets

AMPLIFYING CIRCUIT OF SEMICONDUCTOR INTEGRATED CIRCUIT

CROSS-REFERENCE TO RELATED PATENT APPLICATION

This application claims the benefit of Korean Patent Application No. 10-2006-0076802, filed on Aug. 14, 2006, in the Korean Intellectual Property Office, the disclosure of which is incorporated herein in its entirety by reference.

BACKGROUND OF THE INVENTION

1. Technical Field

The present invention relates to an amplifying circuit of a semiconductor integrated circuit, and more particularly, to an amplifying circuit of a semiconductor integrated circuit that is capable of amplifying input data having a small level difference between logic levels.

2. Related Art

Referring to FIG. 1, a conventional amplifying circuit of a semiconductor integrated circuit includes a differential amplifying unit 10 and a cross coupled amplifying unit 20.

The differential amplifying unit 10 performs primary amplification on input data IN and INb whose level difference is very small in accordance with a first control signal STB1, and outputs a first up-signal OUT1 and a first down-signal OUT1b.

The cross coupled amplifying unit 20 performs secondary amplification on the level difference between the first up-signal OUT1 and the first down-signal OUT1b in accordance with a second control signal STB2, and outputs a second up-signal OUT2 and a second down-signal OUT2b of logic levels.

The first control signal STB1 activates the differential amplifying unit 10, and the second control signal STB2 activates the cross coupled amplifying unit 20.

In the amplifying circuit of the semiconductor integrated circuit according to the related art, when the level difference between the input data IN and INb is very small, the differential amplifying unit 10 performs primary amplification on the level difference between the input data IN and INb. Then, the cross coupled amplifying unit 20 amplifies the level difference between the first up-signal OUT1 and the first down-signal OUT1b, which are output by the differential amplifying unit 10, to a logic level.

The differential amplifying unit 10 may be composed of a plurality of differential amplifiers. For example, as shown in FIG. 1, when the differential amplifying unit 10 is composed of two differential amplifiers, one differential amplifier amplifies the level difference between the input data IN and INb and outputs the first up-signal OUT1. The other differential amplifier amplifies the level difference between the input data IN and INb and outputs the first down-signal OUT1b that has a phase opposite to a phase of the first up-signal OUT1.

The cross coupled amplifying unit 20 receives the first up-signal OUT1 and the first down-signal OUT1b, and amplifies the level difference between the first up-signal OUT1 and the first down-signal OUT1b by an internal feedback operation of the cross coupled amplifying unit 20. Accordingly, the cross coupled amplifying unit 20 outputs the second up-signal OUT2 and the second down-signal OUT2b of the logic levels by the internal feedback operation.

That is, the differential amplifying unit 10 detects the small level difference between the input data IN and INb and amplifies the input data IN and INb so as to be detected by the cross coupled amplifying unit 20. The cross coupled amplifying unit 20 amplifies potential levels of the first up-signal OUT1 and the first down-signal OUT1b, which are output by the differential amplifying unit 10, to the logic levels.

The differential amplifying unit 10 amplifies the level difference between the input data IN and INb by a self gain. Therefore, the differential amplifying unit 10 can perform an amplifying operation stably even if the differential amplifying unit 10 is affected by an offset or noise. However, when signal levels of the input data IN and INb are low, the differential amplifying unit 10 does not amplify potential levels of the first up-signal OUT1 and the first down-signal OUT1b to the logic levels. Meanwhile, the cross coupled amplifying unit 20 can amplify the potential levels of the first up-signal OUT1 and the first down-signal OUT1b to the logic levels by the feedback operation. However, erroneous feedback may occur due to the offset or noise.

The amplifying circuit of the semiconductor integrated circuit according to the related art uses advantages of the differential amplifier and the cross coupled amplifier.

That is, the differential amplifying unit 10 amplifies input data stably by a self gain, and the cross coupled amplifying unit 20 amplifies the potential levels of the first up-signal OUT1 and the first down-signal OUT1b that are output by the differential amplifying unit 10 to the logic levels, and outputs the second up-signal OUT2 and the second down-signal OUT2b. However, since two amplifying steps are needed to amplify one signal, a circuit area is large. In particular, when a large amount of input/output sense amplifiers are used in a semiconductor memory device, the input/output sense amplifiers occupy a relatively large area in the semiconductor integrated circuit.

SUMMARY OF THE INVENTION

Embodiments of the invention provide an amplifying circuit of a semiconductor integrated circuit that is capable of improving amplifying efficiency and reducing the size of an area used.

An embodiment of the invention provides an amplifying circuit of a semiconductor integrated circuit. The amplifying circuit includes a data amplifier that outputs an up-signal and a down-signal amplified according to a comparison result between an up-data signal and a down-data signal in response to a control signal. The data amplifier repeats an operation of amplifying the up-signal and the down-signal according to the comparison result between the up-signal and the down-signal to be fed back to the data amplifier.

DESCRIPTION OF EXEMPLARY EMBODIMENT

Embodiments of the invention will now be described in detail with reference to the accompanying drawings.

Figure 1:
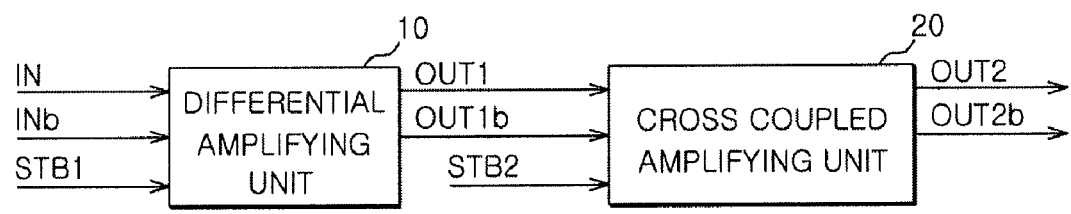
FIG. 1 is a block diagram illustrating a conventional amplifying circuit of a semiconductor integrated circuit.
Figure 2:
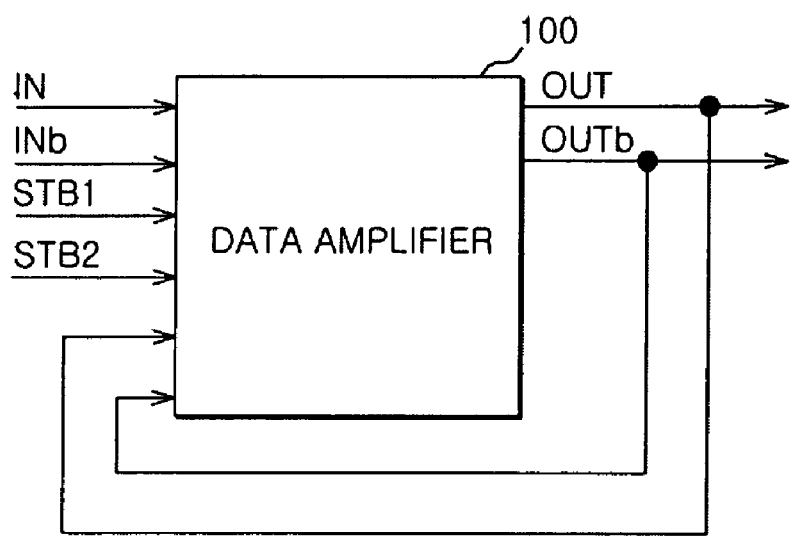
FIG. 2 is a block diagram illustrating an amplifying circuit of a semiconductor integrated circuit according to an embodiment of the present invention.

Referring to FIG. 2, an amplifying circuit of a semiconductor integrated circuit according to an embodiment of the present invention includes a data amplifier 100.

The data amplifier 100 receives control signals STB1 and STB2, an up-data signal IN, and a down-data signal INb. The data amplifier 100 compares the up-data signal IN and the down-data signal INb according to the control signals STB1 and STB2, and outputs an up-signal OUT and a down-signal OUTb that are amplified according to the comparison result. Further, the data amplifier 100 repeats an operation of amplifying the up-signal OUT and the down-signal OUTb according to the comparison result between the up-signal OUT and the down-signal OUTb that are fed back to the data amplifier 100.

The up-data signal IN and the down-data signal INb are signals that are input with inverted phases, and the up-signal OUT and the down-signal OUTb are signals that are output with inverted phases.

Figure 3:
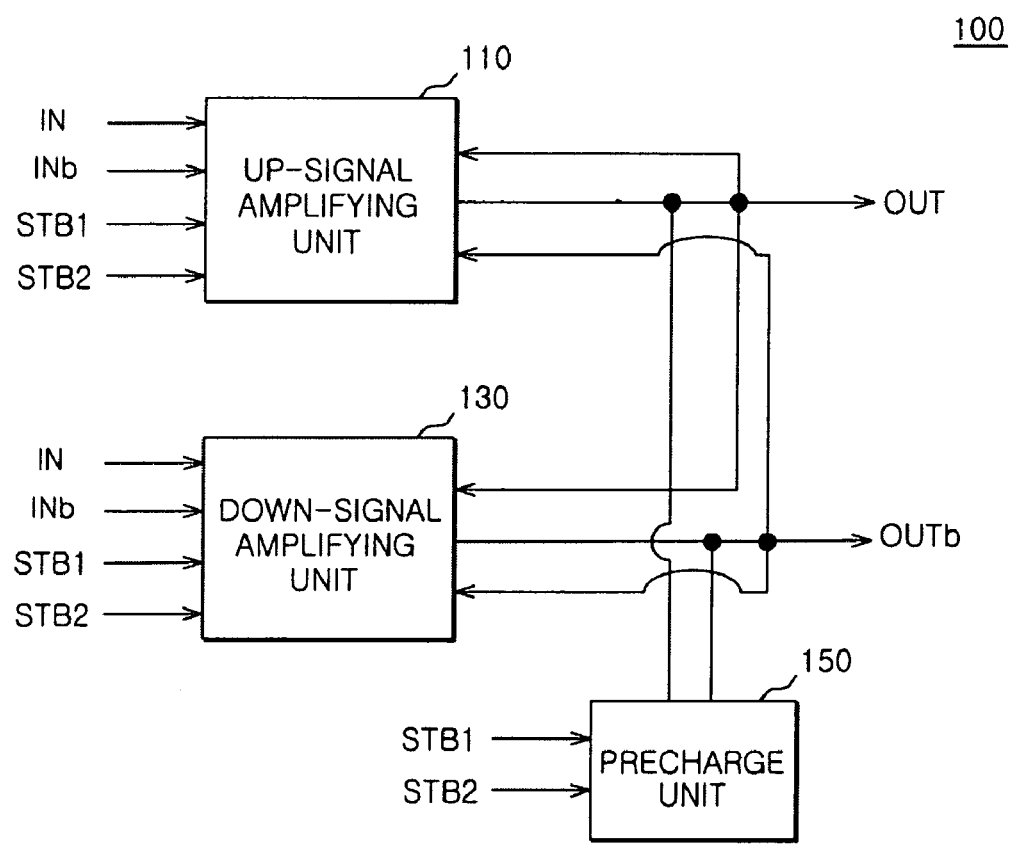
FIG. 3 is a block diagram illustrating a detailed structure of a data amplifier shown in FIG. 2.

Specifically, as shown in FIG. 3, the data amplifier 100 includes an up-signal amplifying unit 110, a down-signal amplifying unit 120, and a precharge unit 150.

The up-signal amplifying unit 110 receives the control signals STB1 and STB2, the up-data signal IN, and the down-data signal INb. The up-signal amplifying unit 110 compares the up-data signal IN and the down-data signal INb according to the control signals STB1 and STB2, and outputs the up-signal OUT. Further, the up-signal amplifying unit 110 further amplifies the up-signal OUT according to the comparison result between the up-signal OUT and the down-signal OUTb that are fed back to the up-signal amplifying unit 110, and outputs the up-signal OUT.

Figure 4:
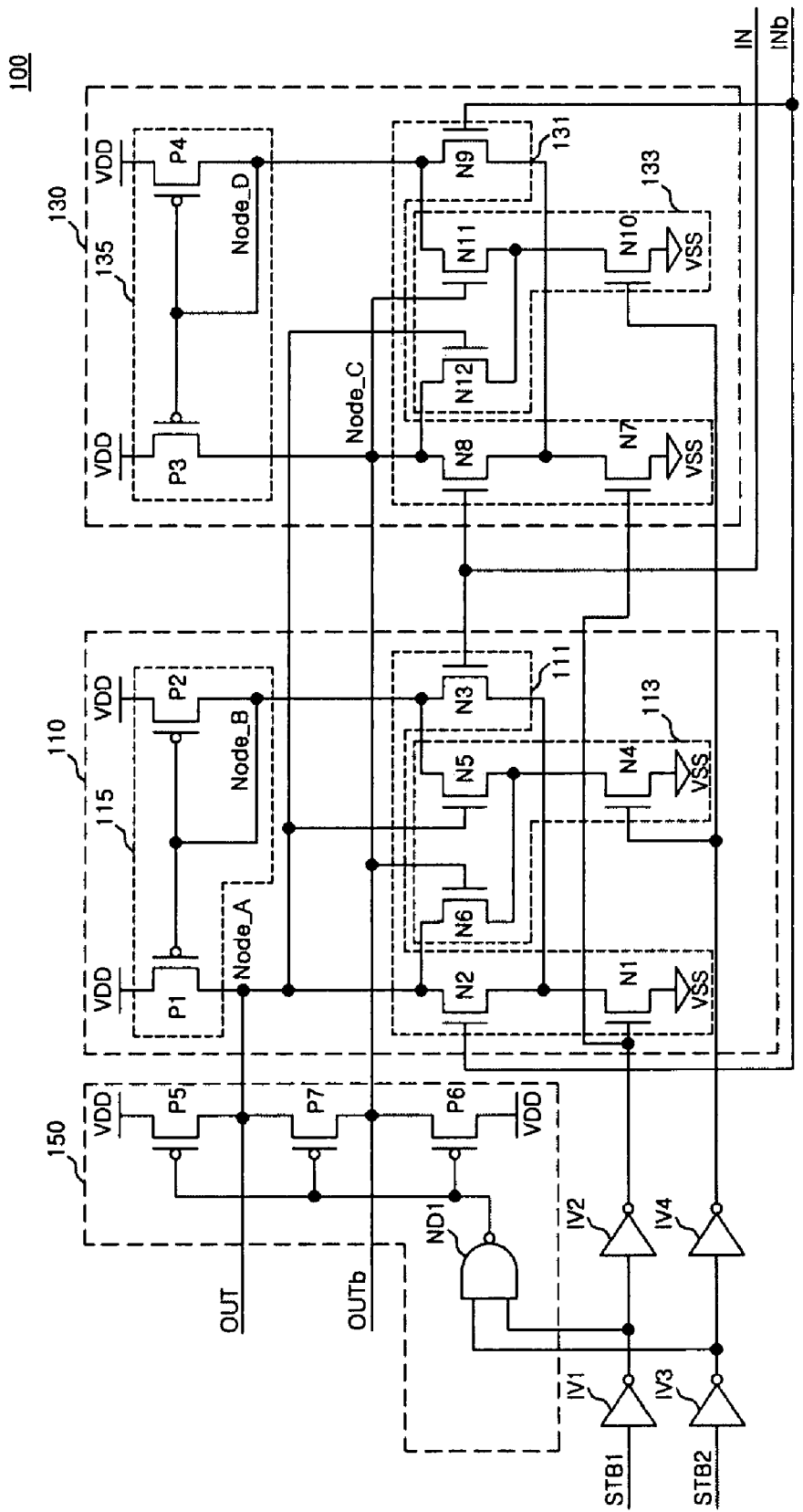
FIG. 4 is a circuit diagram illustrating a data amplifier shown in FIG. 3.

Specifically, as shown in FIG. 4, the up-signal amplifying unit 110 includes a first comparing portion 111, a second comparing portion 113, and a first current mirror portion 115.

The first comparing portion 111 is driven in accordance with the first control signal STB1, and has a current that varies according to the comparison result between the up-data signal IN and the down-data signal INb.

The first comparing portion 111 includes first to third NMOS transistors N1 to N3.

The first NMOS transistor N1 has a gate that receives the first control signal STB1 and a source that is supplied with a ground voltage VSS.

The second NMOS transistor N2 has a gate that receives the down-data signal INb, a drain that is connected to a first node Node_A, and a source that is connected to a drain of the first NMOS transistor N1.

The third NMOS transistor N3 has a gate that receives the up-data signal IN, a drain that is connected to a second node Node_B, and a source that is connected to the drain of the first NMOS transistor N1.

The second comparing portion 113 is driven in accordance with the second control signal STB2, and has a current that varies according to the comparison result between the up-signal OUT and the down-signal OUTb that are fed back to the second comparing portion 113.

The second comparing portion 113 includes fourth to sixth NMOS transistors N4 to N6.

The fourth NMOS transistor N4 has a gate that receives the second control signal STB2 and a source that is supplied with the ground voltage VSS.

The fifth NMOS transistor N5 has a gate that receives the up-signal OUT to be fed back to the data amplifier, a drain that is connected to the second node Node_B, and a source that is connected to a drain of the fourth NMOS transistor N4.

The sixth NMOS transistor N6 has a gate that receives the down-signal OUTb to be fed back to the data amplifier, a drain that is connected to the first node Node_A, and a source that is connected to the drain of the fourth NMOS transistor N4.

The first current mirror portion 115 applies the same current to connecting ends to which the first comparing portion 111 and the second comparing portion 113 are connected.

The first current mirror portion 115 includes first and second PMOS transistors P1 and P2.

The first PMOS transistor P1 has a source that is supplied with an external supply voltage VDD and a drain that is connected to the first node Node_A. The first node Node_A is the drain of the second NMOS transistor N2 of the first comparing portion 111.

The second PMOS transistor P2 has a source that is supplied with the external supply voltage VDD, a gate that is connected to a gate of the first PMOS transistor P1 and the second node Node_B, and a drain that is connected to the second node Node_B. The second node Node_B is the drain of the third NMOS transistor N3 of the first comparing portion 111.

The first node Node_A and the second node Node_B are connecting ends through which the first comparing portion 111, the second comparing portion 113, and the first current mirror portion 115 are connected to one another. In this embodiment, the up-signal OUT is output from the first node Node_A, but the present invention is not limited thereto. That is, the up-signal OUT may be output from the second node Node_B.

Referring back to FIG. 3, the down-signal amplifying unit 130 receives the control signals STB1 and STB2, the up-data signal IN, and the down-data signal INb. In accordance with the control signals STB1 and STB2, the down-signal amplifying unit 130 compares the up-data signal IN and the down-data signal INb, and outputs the amplified down-signal OUTb. Further, the down-signal amplifying unit 130 further amplifies the down-signal OUTb according to the comparison result between the up-signal OUT and the down-signal OUTb that are fed back to the down-signal amplifying unit 130, and outputs the down-signal OUTb.

As shown in FIG. 4, the down-signal amplifying unit 130 includes a third comparing portion 131, a fourth comparing portion 133, and a second current mirror portion 135.

The third comparing portion 131 is driven in accordance with the first control signal STB1, and has a current that varies according to the voltage difference between the up-data signal IN and the down-data signal INb.

The third comparing portion 131 includes seventh to ninth NMOS transistors N7 to N9.

The seventh NMOS transistor N7 has a gate that receives the first control signal STB1 and a source that is supplied with the ground voltage VSS.

The eighth NMOS transistor N8 has a gate that receives the up-data signal IN, a drain that is connected to a third node Node_C, and a source that is connected to a drain of the seventh NMOS transistor N7. A voltage of the third node Node_C is a voltage of the down-signal OUTb that is an output signal.

The ninth NMOS transistor N9 has a gate that receives the down-data signal INb, a drain that is connected to a fourth node Node_D, and a source that is connected to the drain of the seventh NMOS transistor N7.

The fourth comparing portion 133 is driven in accordance with the second control signal STB2, and has a current that varies according to a voltage difference between the up-signal OUT and the down-signal OUTb that are fed back to the fourth comparing portion 133.

The fourth comparing portion 133 includes tenth to twelfth NMOS transistors N10 to N12.

The tenth NMOS transistor N10 has a gate that receives the second control signal STB2 and a source that is supplied with the ground voltage VSS.

The eleventh NMOS transistor N11 has a gate that receives the down-signal OUTb to be fed back to the data amplifier, a drain that is connected to the fourth node Node_D, and a source that is connected to a drain of the tenth NMOS transistor N10. The fourth node Node_D is a drain of the ninth NMOS transistor N9 of the third comparing portion 131.

The twelfth NMOS transistor N12 has a gate that receives the up-signal OUT to be fed back to data amplifier, a drain that is connected to the third node Node_C, that is, the drain of the eighth NMOS transistor N8, and a source that is connected to the drain of the tenth NMOS transistor N10.

The second current mirror portion 135 allows the same current to flow through connecting ends Node_C and Node_D to which the third comparing portion 131 and the fourth comparing portion 133 are connected.

The second current mirror portion 135 includes third and fourth PMOS transistors P3 and P4.

The third PMOS transistor P3 has a source that is supplied with the external supply voltage VDD and a drain that is connected to the third node Node_C, that is, a drain of the eighth NMOS transistor N8.

The fourth PMOS transistor P4 has a source that is supplied with the external supply voltage VDD, a gate that is connected to a gate of the third PMOS transistor P3 and a fourth node Node_D, and a drain that is connected to the fourth node Node_D.

The third node Node_C and the fourth node Node_D are connecting ends through which the third comparing portion 131, the fourth comparing portion 133, and the second current mirror portion 135 are connected to one another. In this embodiment, the down-signal OUTb is output from the third node Node_C, but the present invention is not limited thereto. That is, the down-signal OUTb may be output from the fourth node Node_D.

In accordance with the control signals STB1 and STB2, the precharge unit 150 precharges an output terminal of the up-signal amplifying unit 110 and an output terminal of the down-signal amplifying unit 130.

The precharge unit 150 includes a NAND gate ND1 and a plurality of PMOS transistors P5 to P7.

The NAND gate ND1 receives the control signals STB1 and STB2 through its input terminal.

The plurality of PMOS transistors P5 to P7 have gates that are connected to an output terminal of the NAND gate ND1, and are connected in series to one another. Further, the external supply voltage VDD is applied to both ends of the plurality of PMOS transistors P5 to P7.

A connecting end NODE_A between the fifth PMOS transistor P5 and the seventh PMOS transistor P7 and a connecting end NODE_C between the sixth PMOS transistor P6 and the seventh PMOS transistor P7 are precharged with the external supply voltage VDD in accordance with the first control signal STB1 and the second control signal STB2, or output the up-signal OUT and the down-signal OUTb, respectively.

Further, activation intervals of the control signals STB1 and STB2 are different from each other. The second control signal STB2 is activated after a predetermined time that starts when the first control signal STB1 is activated. The first control signal STB1 is inactivated, and then the second control signal STB2 is inactivated.

The operation of the amplifying circuit of the semiconductor integrated circuit according to an embodiment of the present invention will now be described with reference to FIGS. 2 to 4.

In the amplifying circuit of the semiconductor integrated circuit according to an embodiment of the present invention, the data amplifier 100 amplifies the up-data signal IN and the down-data signal INb that are first input to the amplifying circuit, and outputs the up-signal OUT and the down-signal OUTb. Then, the up-signal OUT and the down-signal OUTb are fed back to the data amplifier 100 so as to be amplified. Accordingly, according to an embodiment of the present invention, even when the difference in a potential level between the up-data signal IN and the down-data signal INb is very small or a gain of an amplifier included in the data amplifier 100 is very small, it is possible to amplify potential levels of the up-signal OUT and the down-signal OUTb to logic levels by using one data amplifier 100.

On the assumption that the up-data signal IN is at a high level and the down-data signal INb is at a low level, the amplifying circuit of the semiconductor integrated circuit according to an embodiment of the present invention will now be described more in detail.

If the first control signal STB1 is activated, the first NMOS transistor N1 and the seventh NMOS transistor N7 are turned on, and thus the up-signal amplifying unit 110 and the down-signal amplifying unit 130 are activated.

Since the up-data signal IN is at a high level and the down-data signal INb is at a low level, a current in the up-signal amplifying unit 110 that flows from the first comparing portion 111 to the second NMOS transistor N2 and the third NMOS transistor N3 is changed. As a result, a potential level of the first node Node_A becomes a high level. That is, even though the first current mirror portion 115 applies the same current to the first node Node_A and the second node Node_B, the amount of current that flows through the third NMOS transistor N3 is larger than the amount of current that flows through the second NMOS transistor N2. Therefore, the up-signal OUT of the high level is output from the first node Node_A.

Since the up-data signal IN is at a high level and the down-data signal INb is at a low level, a current in the down-signal amplifying unit 130 that flows from the third comparing portion 131 to the eighth NMOS transistor N8 and the ninth NMOS transistor N9 is changed. As a result, a potential level of the third node Node_C becomes a low level. That is, the amount of current that flows through the eighth NMOS transistor N8 is larger than the amount of current that flows through the ninth NMOS transistor N9. Therefore, the down-signal OUTb of the low level is output from the third node Node_C.

Then, in a state where the first control signal STB1 is activated, if the second control signal STB2 is activated, the fourth NMOS transistor N4 and the tenth NMOS transistor N10 are turned on according to the second control signal STB2.

Accordingly, since the first control signal STB1 is activated, the first and seventh NMOS transistors N1 and N7 are turned on. As a result, the first comparing portion 111 and the third comparing portion 131 also maintain the activation state.

In the up-signal amplifying unit 110, the difference in a potential level between the up-signal OUT and the down-signal OUTb to be fed back to the up-signal amplifying unit 110 becomes larger than the difference in a potential level between the up-data signal IN and the down-data signal INb that are first input to the data amplifier. Accordingly, the difference between the amount of current flowing through the fifth NMOS transistor N5 and the amount of current flowing through the sixth NMOS transistor N6 becomes larger than the difference between the amount of current flowing through the third NMOS transistor N3 and the amount of current flowing through the second NMOS transistor N2. As a result, the potential level of the first node Node_A is increased.

Meanwhile, in the down-signal amplifying unit 130, the difference between the amount of current flowing through the twelfth NMOS transistor N12 and the amount of current flowing through the eleventh NMOS transistor N11 becomes larger than the difference between the amount of current flowing through the eighth NMOS transistor N8 and the amount of current flowing through the ninth NMOS transistor N9. As a result, the potential level of the third node Node_C is decreased.

Accordingly, the up-signal amplifying unit 110 repeats an operation of increasing a potential level of the up-signal OUT to a potential level of the external supply voltage VDD according to the up-signal OUT and the down-signal OUTb to be fed back to the data amplifier. Further, the down-signal amplifying unit 130 repeats an operation of decreasing a potential level of the down-signal OUTb to a potential level of the ground voltage VSS according to the up-signal OUT and the down-signal OUTb to be fed back to the data amplifier.

Figure 5:
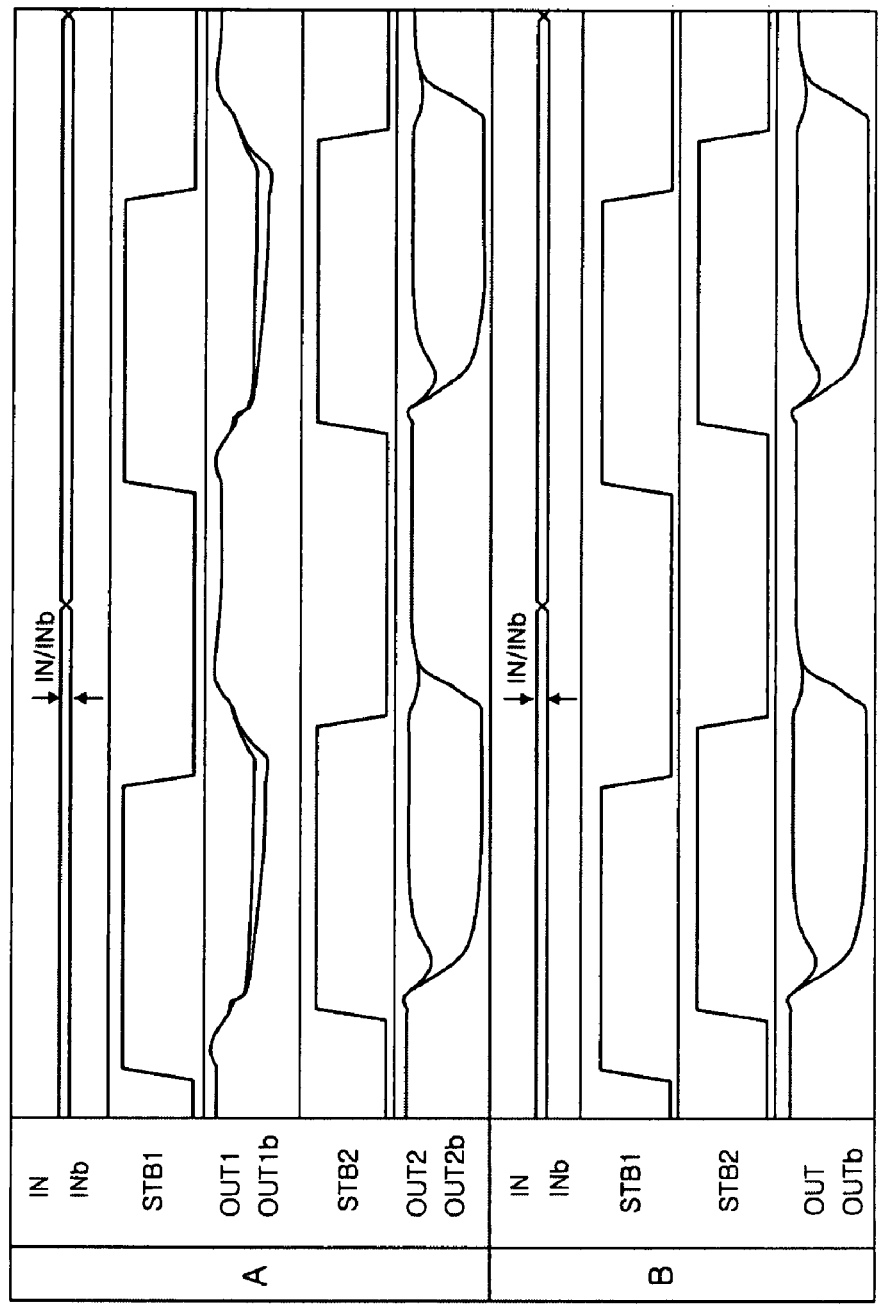
FIG. 5 is a timing diagram comparing the output of an amplifying circuit of a semiconductor integrated circuit according to the related art and the output of an amplifying circuit of a semiconductor integrated circuit according to an embodiment of the present invention.

In a state where the first control signal STB1 is inactivated and the second control signal STB2 is activated, the up-signal amplifying unit 110 and the down-signal amplifying unit 130 operate in the same manner as the case where the first control signal STB1 and the second control signal STB2 are simultaneously activated (see FIG. 5).

When at least one of the first control signal STB1 and the second control signal STB2 is activated at a high level, the control unit 150 turns off the plurality of PMOS transistors P5 to P7 through a first inverting unit IV1, a third inverting unit IV3, and the NAND gate ND1. If both the first control signal STB1 and the second control signal STB2 are inactivated at a low level, the control unit 150 precharges nodes, to which the up-signal OUT an the down-signal OUTb are output through the first inverting unit IV1, the third inverting unit IV3, and the NAND gate ND1, with the external supply voltage VDD.

FIG. 5 is a timing diagram comparing the output of an amplifying circuit of a semiconductor integrated circuit according to the related art and the output of an amplifying circuit of a semiconductor integrated circuit according to an embodiment of the present invention.

In FIG. 5, an A area shows a timing diagram illustrating output of an amplifying circuit of a semiconductor integrated circuit according to the related art, and a B area shows a timing diagram illustrating output of an amplifying circuit of a semiconductor integrated circuit according to an embodiment of the present invention.

As shown in FIG. 5, it can be understood that logic levels (see the A area of FIG. 5) of an up-signal OUT2 and a down-signal OUT2b of the amplifying circuit of the semiconductor integrated circuit according to the related art is similar to logic levels (see the B area of FIG. 5) of the up-signal OUT and the down-signal OUTb of the amplifying circuit of the semiconductor integrated circuit according to the disclosed embodiment of the present invention. That is, according to an embodiment of the present invention, a circuit area can be reduced as compared with the related art while the same amplifying characteristic as the related art is maintained.

As described above, the amplifying circuit of the semiconductor integrated circuit according to the disclosed embodiment of the present invention first amplifies the up-data signal IN and the down-data signal INb and outputs the up-signal OUT and the down-signal OUTb, and repeats an operation of comparing the up-signal OUT and the down-signal OUTb to be fed back to the data amplifier and amplifying the up-signal OUT and the down-signal OUTb according to the comparison result. Accordingly, the amplifying circuit operates in the same manner as the amplifying circuit of the semiconductor integrated circuit according to the related art by using only a differential amplifying operation. As a result, a circuit area can be reduced as compared with the related art while advantages according to the related art are maintained.

The external supply voltage VDD is applied to the first current mirror portion 115, the second current mirror portion 135, and the precharge unit 150. However, since an application voltage may be changed according to an object of a designer, the voltage used in this invention is not limited to the external supply voltage VDD.

The plurality of inverting units IV1 to IV4 that are shown in FIG. 4 can improve a driving force of the control signals STB1 and STB2, and the number of the inverting units may be changed according to an applied object of the circuit.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. An amplifying circuit of a semiconductor integrated circuit, the amplifying circuit comprising:

a data amplifier configured to output an up-signal and a down-signal amplified according to a comparison result between an up-data signal and a down-data signal in response to a control signal, and repeat an operation of amplifying the up-signal and the down-signal according to a comparison result between the up-signal and the down-signal that are fed back as input to the data amplifier, wherein the data amplifier includes:

an up-signal amplifying unit that amplifies the up-signal according to the comparison result between the up-data signal and the down-data signal in response to the control signal and amplifies the up-signal according to the comparison result between the up-signal and the down-signal fed back to the data amplifier, and a down-signal amplifying unit that amplifies the down-signal according to the comparison result between the up-data signal and the down-data signal in response to the control signal and further amplifies the down-signal according to the comparison result between the up-signal and the down-signal fed back to the data amplifier, wherein the control signal includes a first control signal and a second control signal having activation intervals that are different from each other, wherein the up-signal amplifying unit includes a first comparing portion that is driven in accordance with the first control signal, and has a current that varies according to the comparison result between the up-data signal and the down-data signal, a second comparing portion that is driven in accordance with the second control signal, and has a current that varies according to the comparison result between the up-signal and the down-signal fed back to the data amplifier, and a first current mirror portion that applies a same current to first and second nodes to which the first comparing portion and the second comparing portion are connected respectively.

2. The amplifying circuit of claim 1, further comprising:
a precharge unit that precharges an output terminal of the up-signal amplifying unit and an output terminal of the down-signal amplifying unit in accordance with the control signal.

3. The amplifying circuit of claim 1,
wherein the second control signal is activated after the first control signal is activated.

4. The amplifying circuit of claim 3,
wherein the second control signal is inactivated after the first control signal is inactivated.

5. The amplifying circuit of claim 1,
wherein the up-signal amplifying unit selectively outputs the up-signal at the first node or the second node.

6. The amplifying circuit of claim 5,
wherein the down-signal amplifying unit includes
a third comparing portion that is driven in accordance with the first control signal, and has a current that varies according to the comparison result between the up-data signal and the down-data signal,
a fourth comparing portion that is driven in accordance with the second control signal, and has a current that varies according to the comparison result between the up-signal and the down-signal fed back to the data amplifier, and
a second current mirror portion that applies a same current to third and fourth nodes to which the third comparing portion and the fourth comparing portion are connected.

7. The amplifying circuit of claim 6,
wherein the down-signal amplifying unit selectively outputs the down-signal at the third node or the fourth node.

8. The amplifying circuit of claim 6,
wherein the third comparing portion includes
a first NMOS transistor that has a drain, a gate receiving the first control signal and a source supplied with a ground voltage,
a second NMOS transistor that has a gate receiving the up-data signal, a drain connected to the third node, and a source connected to the drain of the first NMOS transistor, and
a third NMOS transistor that has a gate receiving the down-data signal, a drain connected to the fourth node, and a source connected to the drain of the first NMOS transistor.

9. The amplifying circuit of claim 8,
wherein the fourth comparing portion includes
a fourth NMOS transistor that has a drain, a gate receiving the second control signal and a source supplied with the ground voltage,
a fifth NMOS transistor that has a gate receiving the down-signal fed back to the data amplifier, a drain connected to the fourth node, and a source connected to the drain of the fourth NMOS transistor, and a sixth NMOS transistor that has a gate receiving the up-signal fed back to the data amplifier, a drain connected to the third node, and a source connected to the drain of the fourth NMOS transistor.

10. The amplifying circuit of claim 9,
wherein the second current mirror portion includes
a first PMOS transistor that has a gate, a source supplied with an external supply voltage and a drain connected to the third node, and
a second PMOS transistor that has a source supplied with the external supply voltage, a gate connected to the gate of the first PMOS transistor and the fourth node, and a drain connected to the second node.

11. The amplifying unit of claim 1,
wherein the first comparing portion includes
a first NMOS transistor that has a drain, a gate receiving the first control signal and a source that is supplied with a ground voltage,
a second NMOS transistor that has a gate receiving the down-data signal, a drain connected to the first node, and a source connected to the drain of the first NMOS transistor, and
a third NMOS transistor that has a gate receiving the up-data signal, a drain connected to the second node, and a source connected to the drain of the first NMOS transistor.

12. The amplifying circuit of claim 11,
wherein the second comparing portion includes
a fourth NMOS transistor that has a drain, a gate receiving the second control signal and a source supplied with the ground voltage,
a fifth NMOS transistor that has a gate receiving the up-signal fed back to the data amplifier, a drain connected to the second node, and a source connected to the drain of the fourth NMOS transistor, and
a sixth NMOS transistor that has a gate receiving the down-signal fed back to the data amplifier, a drain connected to the first node, and a source connected to the drain of the fourth NMOS transistor.

13. The amplifying circuit of claim 12,
wherein the first current mirror portion includes
a first PMOS transistor that has a gate, a source applied with an external supply voltage and a drain connected to the first node, and
a second PMOS transistor that has a source applied with the external supply voltage, a gate connected to the gate of the first PMOS transistor and the second node, and a drain connected to the second node.

14. The amplifying circuit of claim 2,
wherein the precharge unit includes
a NAND gate that has an input terminal receiving the control signal and an output terminal, and
a plurality of transistors that have gates connected to the output terminal of the NAND gate, and are connected in series to one another, and
an external supply voltage applied to both ends of the plurality of transistors.

15. The amplifying circuit of claim 14,
wherein, in the precharge unit, connecting ends between the plurality of the transistors are connected to the output terminal of the up-signal amplifying unit and the output terminal of the down-signal amplifying unit.

* * * * *